United States Patent
Zeika et al.

(10) Patent No.: US 9,722,190 B2
(45) Date of Patent: *Aug. 1, 2017

(54) USE OF SQUARE PLANAR TRANSITION METAL COMPLEXES AS DOPANT

(75) Inventors: Olaf Zeika, Dresden (DE); Rene Dathe, Chemnitz (DE); Steffen Willmann, Dresden (DE); Ansgar Werner, Dresden (DE)

(73) Assignee: Novaled GmbH, Dresden (DE)

( * ) Notice: Subject to any disclaimer, the term of this patent is extended or adjusted under 35 U.S.C. 154(b) by 206 days.

This patent is subject to a terminal disclaimer.

(21) Appl. No.: 12/301,828

(22) PCT Filed: May 24, 2007

(86) PCT No.: PCT/EP2007/004638
§ 371 (c)(1),
(2), (4) Date: Mar. 23, 2009

(87) PCT Pub. No.: WO2007/134873
PCT Pub. Date: Nov. 29, 2007

(65) Prior Publication Data
US 2010/0044683 A1   Feb. 25, 2010

(30) Foreign Application Priority Data

May 24, 2006   (EP) .................................... 06010719

(51) Int. Cl.
*H01L 51/00*   (2006.01)

(52) U.S. Cl.
CPC ........ *H01L 51/0083* (2013.01); *H01L 51/002* (2013.01); *H01L 51/0077* (2013.01); *H01L 51/0059* (2013.01); *H01L 51/0062* (2013.01); *Y02B 10/10* (2013.01); *Y02E 10/549* (2013.01)

(58) Field of Classification Search
CPC .................................................. H01L 51/0083
See application file for complete search history.

(56) References Cited

U.S. PATENT DOCUMENTS

| | | | |
|---|---|---|---|
| 4,606,326 A * | 8/1986 | Giordano, Jr. ........ | B01J 19/122 |
| | | | 126/400 |
| 5,792,568 A | 8/1998 | Emoto et al. | |
| 6,645,579 B1 * | 11/2003 | Tsuboyama et al. ....... | 428/1.4 |
| 6,908,783 B1 | 6/2005 | Kuehl et al. | |
| 6,984,591 B1 | 1/2006 | Buchanan et al. | |
| 7,074,500 B2 | 7/2006 | Pfeiffer et al. | |
| 7,655,961 B2 * | 2/2010 | Marrocco et al. ........... | 257/184 |
| 7,745,627 B2 * | 6/2010 | Stossel et al. .................. | 546/2 |
| 2002/0042174 A1 | 4/2002 | Kunugi et al. | |
| 2002/0179885 A1 | 12/2002 | Che et al. | |
| 2003/0186080 A1 | 10/2003 | Kamatani et al. | |
| 2003/0205707 A1 | 11/2003 | Chi-Ming et al. | |
| 2004/0062949 A1 | 4/2004 | Pfeiffer et al. | |
| 2004/0065544 A1 | 4/2004 | Igarashi et al. | |
| 2004/0121184 A1 | 6/2004 | Thompson et al. | |
| 2004/0241492 A1 | 12/2004 | Tokuda | |
| 2004/0262576 A1 | 12/2004 | Thompson et al. | |
| 2005/0061232 A1 | 3/2005 | Werner et al. | |
| 2005/0221115 A1 | 10/2005 | Tsuboyama et al. | |
| 2005/0242346 A1 | 11/2005 | Forrest et al. | |
| 2005/0260449 A1 | 11/2005 | Walters et al. | |
| 2006/0071206 A1 | 4/2006 | Stossel et al. | |
| 2006/0208252 A1 | 9/2006 | Wessels et al. | |
| 2006/0258043 A1 | 11/2006 | Bold et al. | |
| 2007/0111025 A1 | 5/2007 | Lennartz et al. | |
| 2007/0135635 A1 | 6/2007 | Stoessel et al. | |
| 2007/0264524 A1 | 11/2007 | Gessner et al. | |
| 2008/0121870 A1 | 5/2008 | Seth et al. | |
| 2009/0318698 A1 | 12/2009 | Hortmann et al. | |

FOREIGN PATENT DOCUMENTS

| DE | 4112793 | 10/1992 |
|---|---|---|
| GB | 1436230 | 5/1976 |
| JP | 3-208689 A | 9/1991 |
| JP | 03208689 | 9/1991 |
| JP | 2000-252077 A | 9/2000 |
| JP | 2002-164177 | 6/2002 |
| WO | WO 2004/017043 | 2/2004 |
| WO | WO 2005/086251 | 9/2005 |

OTHER PUBLICATIONS

Noro et al, J. Am. Chem. Soc. Jun. 23, 2005 "Metal-Organic . . . Nickel(II) Complex" http://pubs.acs.org/doi/pdf/10.1021/ja052663s.*
Adachi, C. et al. "High-efficiency red electrophosphorescence devices," Appl. Phys. Lett. 2001, 78, 1622.
Beckert, R. et al., "Syntheses and properties of cycloamidines based on 4H-imidazoles," Z. Naturforschung B, vol. 61, No. 4 (2006).
Blochwitz, J., et al., "Low voltage organic light emitting diodes featuring doped phthalocyanine as hole transport material," Applied Physics Letters, vol. 73, No. 6, Aug. 10, 1998, pp. 729-731.
Chassot, L. and Von Zelewsky, A., "Cyclometalated Complexes of Platinum (II): Homoleptic Compounds with Aromatic C, N Ligands," Inorg. Chem. (1987), 26, 2814-2818.
Cocchi, M. et al., "Highly efficient organic electroluminescent devices based on cyclometallated platinum complexes as new phosphorent emitters," Synthetic Metals, 147, 253-256, (2004).
Cocchi, M. et al., "Highly efficient organic electroluminescent light-emitting diodes with a reduced quantum efficiency roll off at large current densities," Applied Physics Letters, 84, 7, 1052-1054 (2004).
Davison, A. et al., "Further Examples of Complexes Related by Electron-Transfer Reactions: Complexes Derived from Bis9trifluoromethyl)-1,2-dithietene," Inorg. Chem. (1964) 3/6 p. 814.
Denmark, S. et al., "Cyclopropanation with Diazomethane and Bis(Oxazoline) Palladium (II) Complexes," Journal of Organic Chemistry, 62, No. 10, May 16, 1997.

(Continued)

*Primary Examiner* — Jerome Jackson, Jr.
(74) *Attorney, Agent, or Firm* — Eversheds Sutherland (US) LLP

(57) ABSTRACT

The present invention relates to the use of a square planar transition metal complex as dopant, charge injection layer, electrode material or storage material.

8 Claims, No Drawings

(56) References Cited

OTHER PUBLICATIONS

Doucet, et al., "Palladium-Based Catalytic Systems for the Synthesis of Conjugated Enynes by Sonogashira Reactions and Related Alkynylations," Angew. Chem. Int. Ed. (2007) 46, 834.
Gareau, Y. et al. "Free Radical Reaction of Diisopropyl Xanthogen Disulfide with Unsaturated Systems," Heterocycles (1998) 48, p. 2003.
Gebauer, T. et al., "Mesoionic bora-tetraazapentalenes—fully reversible two step redox systems," Chemical Communications (2004), (16), 1860-1861.
Huang et al., "Synthesis of Perfluoro-2-alkynenitriles," Tetrahedron Letters (1981) 22, p. 5283.
Krebs et al., "Strained Cyclic Acetylenes, VII Addition of Sulfur and Pyridine-N-Oxide to Seven Membered Cycloalkynes," Heterocycles (1979) 12, p. 1153.
Krespan, C.G.; "Bis-(polyfluoroalkyl)-acetylenes. IV. Fluorinated Dithietenes and Related Heterocyclic Compounds From Bis-(polyfluoroalkyl)-acetylenes and Sulfur," J.Am. Chem. Soc. (1961) 83, 3434.
Lo, K. M., et al., "Synthesis and spectroscopic studies of thienyl triorganotin (IV) compounds," J. Organometal. Chem. (1992), 430, 149.
Marder et al., "Synthesis, Optical Properties, Crystal Stuctures and Phase Behavior of Selectively Fluorinated 1,4-bis(4'-pyridylethynyl)benzenes, 4-(phenylethynyl)pyridines and 9,10-bis(4'-pyridylethynyl)-anthracene, and a $Zn(NO_3)_2$ Coordination Polymer," J. Mater. Chem. (2004) 14, 2395.
Mayer, R., et al. "Synthese der 1,3-Dithiol-2-thione," Angew. Chem. (1964) 76, p. 143.
Nakayama, J. et al., "A Convenient Synthesis of 1,2-Dithietes and 1,2-Dithioxo Compounds Stabilized by Buttressing and Resonance Effects, Respectively, by Sulfuration of Alkynes with Elemental Sulfur," Bull. Chem. Soc. Jpn. (1993) 66, p. 623.
Okada, S. et al. "Substituent effects of iridium complexes for highly efficient red OLEDs," Dalton Trans., 2005, 1583.
Pereira, R. P. et al., "Electrosynthesis and characterization of polypyrrole doped with [Bi(dmit)2]<->," Synthetic Metals, Apr. 20, 2005, p. 21-26.
Pfeiffer, M. et al., "Controlled doping of phthalocyanine layers by cosublimation with acceptor molecules: A systematic Seebeck and conductivity study," Applied Physics Letters, vol. 73, No. 22 Nov. 20, 1998, pp. 3202-3204.
Schrauzer, et al. "Preparation, Reactions, and Structure of Bisdithio-α-diketone Complexes of Nickel, Palladium, and Platinum," J. Am. Chem. Soc. (1965) 87/7 1483-9.
Schrauzer, et al., "Reaktionen von Ubergangsmetallsulfiden mit Alkinen. Zur Kenntnis von Metallkomplexen der α-β-Dithiodiketone," Z. Naturforschg. (1964) 19b, 192-8.
Shinar, J. "Organic Light-Emitting Devices—A Survey," AIP-Press, Springer, New York 2004.
Sonogahsira, et al., "A Convenient Synthesis of Acetylenes: Catalytic Substitutions of Acetylenic Hydrogen with Bromoalkenes, Iodoarenes, and Bromopyridines." Tetrahedron Letters (1975) 50, 4467.
Sotoyama, W. et al. "Efficient organic light-emitting diodes with phosphorescent platinum complexes containing N-C-N-coordinating tridentate ligand," Appl. Phys. Lett. 2005, 86, 153505.
Taguchi, et al., "Comparison of p-type and n-type organic field-effect transistors using nickel coordination compounds," Chemical Physics Letters, Apr. 15, 2006, p. 395-398.
Tang, C.W. et al., "Organic electroluminescent diodes," Applied Physics Letters, vol. 51, No. 12, Sep. 21, 1987, pp. 913-915.
Tarraga, A. et al., "Synthesis and electrochemical study of novel and oxazolo-ferrocene derivatives displaying redox-switchable character," Tetrahedron, 57, 31, Jul. 30, 2001, pp. 6765-6774.
Tung, Y. L. et al. "Organic light-emitting diodes based on charge-neutral Os(II) emitters: generation of saturated red emission with very high external quantum efficiency," J. Mater. Chem., 2005, 15, 460-464.
Yang, X. H. et al. "Polymer electrophosphorescence devices with high power conversion efficiencies," Appl. Phys. Lett. 2004, 84, 2476.
Yersin, H. and Donges, D. "Low-Lying Electronic States and Photophysical Properties of Organometallic Pd(II) and Pt(II) Compounds. Modern Research Trends Presented in Detailed Case Studies," Topics in Curr. Chem. (2001), 214, 81.
Yersin, H. "Highly Efficient OLEDs with Phosphorescent Materials," Wiley-VCH 2006.
International Search Report, International App. No. PCT/EP2007/006683, Nov. 13, 2007.
International Search Report, International App. No. PCT/EP2007/004638, Jul. 23, 2007.
International Search Report, International App. No. PCT/DE2006/002330, Apr. 24, 2007.
International Search Report, International App. No. PCT/DE2007/000587, Sep. 11, 2007.
Disclosure Under 37 C.F.R. 1.56 for U.S. Appl. No. 12/301,828 (Submitted Herewith).
Japanese Office Action for JP Application No. 2009-511417 mailed Oct. 2, 2012 (8 pages).
Korean Office Action mailed Oct. 17, 2013 for Korean Application No. 10-2008-7031236 (6 pages).
Translation of Japanese Decision of Refusal mailed Dec. 2, 2013 (6 pages).
Olson et al., "Polarographic Study of Coordination Compounds with Delocalized Ground States. Substituent Effects in Bis- and Trisdithiodiketone Complexes of Transition Metals," 1966, Journal of the American Chemical Society, 88 (21):4876-4882.
Papavassiliou et al., "Some Unsymmetrical Metal 1,2-Dithiolenes Based on Palladium, Platinum and Gold," 2008, Z. Naturforsch, 63b:1377-1382.
SciFinder Search Report of references generated during examination of the Korean counterpart application No. 10-2008-7031236.
SciFinder Search Report of structures generated during examination of the Korean counterpart application No. 10-2008-7031236.

\* cited by examiner

USE OF SQUARE PLANAR TRANSITION METAL COMPLEXES AS DOPANT

CROSS-REFERENCE TO RELATED APPLICATION

This is a submission pursuant to 35 U.S.C. 154(d)(4) to enter the national stage under 35 U.S.C. 371 for PCT/EP2007/004638 filed May 24, 2007. Priority is claimed under 35 U.S.C. 119(a) and 35 U.S.C. 365(b) to European Patent Application No. 06010719.0 filed May 24, 2006. The subject matters of PCT/DE2007/004638 and European Patent Application No. 06010719.0 are hereby expressly incorporated herein by reference in their entirety.

The present invention relates to the use of a square planar transition metal complex as dopant for doping an organic semiconductive matrix material, as charge injection layer, as electrode material and as storage material in electronic or optoelectronic components.

It is known that organic semiconductors can be changed as regards their electrical properties, especially their electrical conductivity, as is also the case with inorganic semiconductors such as silicon semiconductors. An elevation of the conductivity, which is rather low at first, as well as a change in the Fermi level of the semiconductor according to the type of dopant used is achieved here by producing charge carriers in the matrix material. A doping results here in an elevation of the conductivity of charge transport layers, which reduces ohmic losses and in an improved transition of the charge carriers between contacts and organic layer.

Inorganic dopants such as alkali metals (e.g. cesium) or Lewis acids (e.g. $FeCl_3$) are mostly disadvantageous in organic matrix materials on account of their high diffusion coefficients, since the function and stability of the electronic components is adversely affected. Further, these materials are highly volatile and thus lead to an increasing contamination of the vaporization apparatus. Furthermore, the release of dopants via chemical reactions into the semiconductive matrix material in order to make dopants available is known. However, the reduction potential of such released dopants is often not sufficient for various instances of application such as, in particular, for organic light-emitting diodes (OLED). Furthermore, further compounds and/or atoms, for example, atomic hydrogen, are also produced in the release of the dopants, which affects the properties of the doped layer and of the corresponding electronic component.

The acceptor-like material can also be used as hole injection layer. Thus, for example, a layered structure anode/acceptor/hole transporter can be produced, in this case, the hole transporter can be a pure layer or a mixed layer. In particular, the hole transporter can also be doped with an acceptor. The anode can be ITO, for example. The acceptor layer can be 0.5-100 nm thick, for example.

Square planar transition metal complexes are known, for example, from the WO 2005/123754 A2, whose complexes can be used in a great plurality of electronic applications, for example, in active electronic components, passive electronic components, in electroluminescence devices (e.g. organic light-emitting diodes), photovoltaic cells, light-emitting diodes, field effect transistors, photo transistors, etc. The use of the described square planar transition metal complexes is indicated as charge transport material.

The present invention has the object of providing improved semiconductive matrix materials, charge injection layers, electrode materials and storage materials, in particular in electronic or optoelectronic components. In particular for doped organic semiconductive matrix materials, the compounds used as dopants should lead to sufficiently high reduction potentials without disturbing influences on the matrix material itself and provide an effective elevation of the charge carrier number in the matrix material, and be able to be handled in a comparatively simple manner.

Further objects of the present invention reside in providing organic semiconductive materials and electronic components or optoelectronic components.

The first object is achieved by the square planar transition metal complex having one of the following structures (I) or (II):

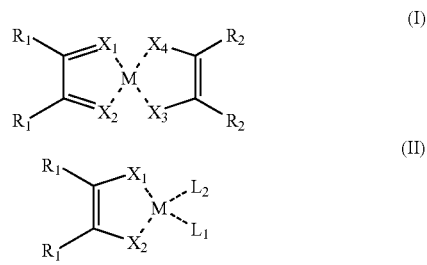

in which M is a transition metal selected from the groups 8 to 11 of the periodic system of the elements, $X_1$, $X_2$, $X_3$ and $X_4$ are independently selected from S, Se, $NR_5$ und $PR_5$, wherein $R_5$ is selected from, substituted or unsubstituted, linear or branched alkyl, cycloalkyl, aryl, heteroaryl, condensed aromatic rings, donor groups and acceptor groups, $R_1$ and $R_2$ are independently selected from, substituted or unsubstituted, aromatics, heteroaromatics, aliphatic hydrocarbons, cycloaliphatic hydrocarbons, and nitrile, $L_1$ and $L_2$ are independently selected from aromatic amine, aromatic phosphine, halogen, pseudohalogen, NCS, SCN and CN.

Preferably, M is selected from nickel, copper, palladium, platinum, iron, ruthenium and osmium, preferably nickel, cobalt and iron.

It is also preferred to select $R_1$ und $R_2$ from substituted phenyl, preferably trifluoromethylphenyl, anisyl, tolyl, 2-pyridyl, methyl, propyl, isopropyl, trifluoromethyl, pentafluoroethyl and trichloromethyl.

The further objects are achieved by an organic semiconductive material according to Claim 4 as well as by an electronic or optoelectronic component according to Claim 6. Further preferred embodiments result from the subclaims.

It was surprisingly found that when using the disclosed transition metal complexes in accordance with the invention a substantially stronger and/or more stable dopant is present than in the case of previously known acceptor compounds, with the square planar transition metal complexes being used here in neutral form as a p-dopant in combination with an organic semiconductive matrix material. In particular, the conductivity of charge transport layers is significantly raised when using the complexes according to the invention and/or the transition of the charge carriers between the contacts and organic layer while applying them as electronic components is significantly improved. Without being limited by this conception, it is assumed that when using the disclosed transition metal complexes in accordance with the invention in a doped layer, CT complexes are formed, in particular by the transfer of at least one electron from the respective surrounding matrix material. Likewise, cations of the matrix material are formed here having mobile holes on the matrix material. In this manner, the matrix material gains a conductivity that is greater in comparison to the conductivity of the undoped matrix material. Conductivities of undoped matrix materials are usually <$10^{-8}$ s/cm, in particular frequently <$10^{-10}$ s/cm. Care is to be taken here that the matrix materials have a sufficiently high purity. Such purities can be achieved with traditional methods, for example, gradient sublimation. By doping, the conductivity of such matrix material can be raised to greater than $10^{-8}$ s/cm, frequently >$10^{-5}$ S/cm. This applies in particular to matrix materials that have an oxidation potential greater than −0.5 V vs. Fc/Fc$^+$, preferably greater than 0 V vs. Fc/Fc$^+$, in particular greater than +0.2 V vs. Fc/Fc$^+$. The indication Fc/Fc$^+$ refers to the redox pair ferrocene/ferrocenium that is used as reference in an electrochemical determination of potential, for example, cyclovoltammetry.

It was furthermore determined in accordance with the invention that the described square planar transition metal complexes can also be used as injection layer in electronic components, preferably between an electrode and a semiconductor layer, which can also be doped, in electronic components. The described square planar transition metal complexes can also be used according to the invention as part of a charge carrier generation layer, for example, by using them in a layer bordering on another p-doped or n-doped layer. In the use in accordance with the invention the described planar transition compounds are preferably isolated molecules that are thus preferably present in the respective semiconductive layer as isolated molecules that are not fixed by chemical bonds to each other and/or to a matrix or to another component. The complexes have a surprisingly high stability as regards their reactivity with the atmosphere.

Synthesis Processes

Square planar transition metal complexes as described herein can be synthesized according to known processes and are also partly commercially obtainable. The synthesis of such compounds is described, for example, in the following literature passages that are included herewith in the application to their full extent as reference. It is understood that the cited literature passages are indicated only by way of example. According to Schrauzer et al. such transition metal complexes can be prepared from 1,2-diketones or 2-hydroxyketones, phosphorus pentasulfide and a suitable transition metal salt, J. Am. Chem. Soc. (1965) 87/7 1483-9. The conversion of transition metal carbonyls with sulphur and acetylenes also results in the complexes in accordance with the invention, A. Davison et al. Inorg. Chem. (1964) 3/6 814. Instead of the transition metal carbonyls even other formally 0-valent transition metal compounds such as, for example, appropriate cyclooctadienyls, phosphines, etc., but also pure transition metals can be used, G. N. Schrauzer et al. Z. Naturforschg. (1964) 19b, 192-8.

Doping

Among others, phthalocyanine complexes, for example, Zn (ZnPc), Cu (CuPc), Ni (NiPc) or other metals can be used as p-dopable matrix materials and the phthalocyanine ligand can also be substituted. Other metallic complexes of naphtocyanines and porphyrines can also be optionally used. Furthermore, even arylated or heteroarylated amines and benzidine derivatives can also be used as matrix material that can be substituted or non-substituted, especially also spiro-linked ones, for example, TPD, α-NPD, TDATA, Spiro-TTB. Preferably, NPD can be used as matrix material.

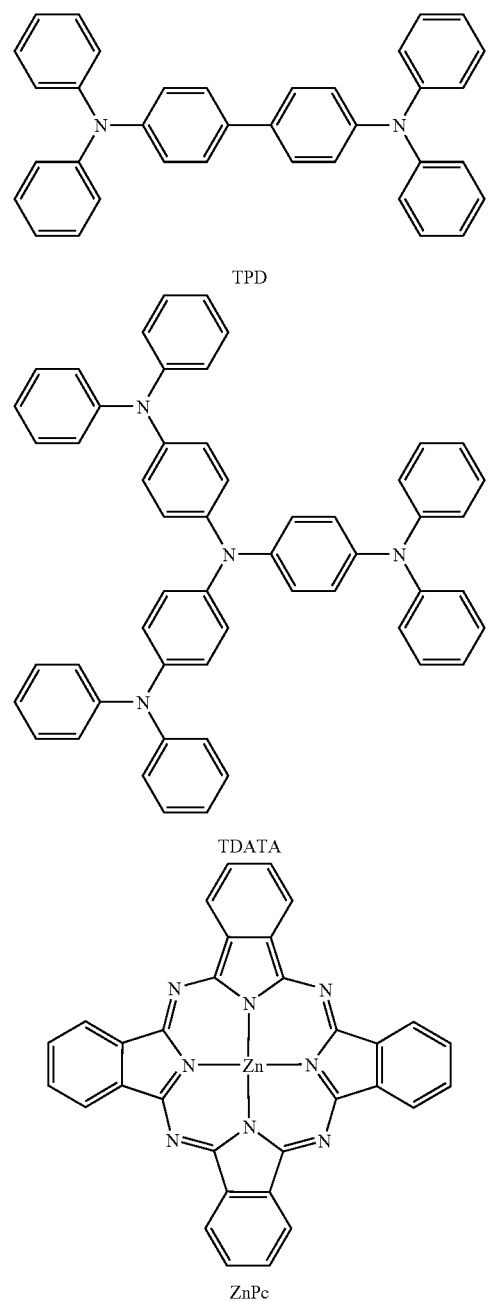

In addition to polyaromatic hydrocarbons, heteroaromatic compounds such as especially imidazole, thiophene, thiazole derivatives, heterotriphenylenes or also others can also be used as matrix material, optionally also dimeric, oligomeric or polymeric heteroaromatic compounds. The heteroaromatic compounds are preferably substituted, especially aryl-substituted, for example, phenyl- or naphthyl-substituted. They can also be present as Spiro compounds.

It is understood that the mentioned matrix materials can also be used mixed with each other or with other materials within the scope of the invention. It is understood that other suitable organic matrix materials can also be used that have semiconductive, particularly hole conductive properties.

Doping Concentration

The dopant is preferably present in the doping concentration of ≤1:1 to the matrix molecule or to the monomeric unit of a polymeric matrix molecule, such as in a doping concentration of 1:2 or less, especially preferably 1:5 or less or 1:10 or less. The doping concentration can be in the range of 20:1 to 1:100,000, in particular in the range of 10:1 to 1:1,000, preferably in the range of 1:1 to 1:100, without being limited thereto.

Carrying Out of the Doping

The doping of the particular matrix material with the compounds used in accordance with the invention can take place by one or a combination of the following processes:
a) Mixed evaporation in the vacuum with a source for the matrix material and one for the dopant.
b) Sequential depositing of the matrix material and of the p-dopant on a substrate with subsequent inward diffusion of the dopant, in particular by thermal treatment.
c) Doping of a matrix layer by a solution of p-dopant with subsequent evaporation of the solvent, in particular by thermal treatment.
d) Surface doping of a matrix material layer by a layer of dopant applied on the surface.
e) Preparation of a solution of matrix molecules and dopant and subsequent preparation of a layer of this solution by conventional methods such as, for example, evaporation of the solvent or spin-coating.

Thus, p-doped layers of organic semiconductors can be prepared in this manner that can be used in multiple ways.

Semiconductive Layer

Semiconductive layers can be produced by the electron-poor transition metal complex compounds used in accordance with the invention that are optionally formed rather linearly, e.g., as conductivity paths, contacts or the like.

Semiconductive layers with conductivities at room temperature in the range of $10^{-5}$ s/cm or higher can be achieved, for example, of $10^{-3}$ s/cm or higher by means of the electron-poor compounds used in accordance with the invention as p-dopants, for example, when using Spiro-TTB or ZnPc as matrix. When using phthalocyanine zinc as matrix a conductivity of greater than $10^{-8}$ s/cm was achieved, for example, $10^{-6}$ s/cm. It was previously not possible to dope this matrix with organic acceptors since the oxidation potential of the matrix was too low. In contrast thereto, the conductivity of undoped phthalocyanine is maximally $10^{-10}$ s/cm.

It is understood that the layer or the structure with the dopants can each contain one or more different such electron-poor transition metal complex compounds.

Electronic Component

A plurality of electronic components or equipment containing them can be produced with a p-doped organic semiconductor layer using the described compounds for producing p-doped organic semiconductive materials that can be arranged in particular in the form of layers or electric wiring paths. In the sense of the invention the concept "electronic components" also comprises optoelectronic components. The electronic properties of an area of the component that is electronically functionally active such as its electrical conductivity, light-emitting properties or the like, can be advantageously changed by the described compounds. Thus, the conductivity of the doped layers can be improved and/or the improvement of the charge carrier injection of contacts into the doped layer can be achieved.

The invention comprises in particular organic light-emitting diodes (OLED), organic solar cells, field effect transistors, organic diodes, in particular those with high rectification ratio such as $10^3$-$10^7$, preferably $10^4$-$10^7$ or $10^5$-$10^7$, and organic field effect transistors produced by means of the electron-poor transition metal complex compounds.

A p-doped layer based on an organic matrix material can, for example, be present in the electronic component in the following layer structures, in which the base materials or matrix materials of the individual layers are preferably organic:

p-i-M: p-doped semiconductor-insulator-metal,
M-i-p: metal-insulator-p-doped semiconductor,
p-i-n: p-doped semiconductor-insulator-n-doped semiconductor,
n-i-p: n-doped semiconductor-insulator-p-doped semiconductor.

"i" is again an undoped layer, "p" is a p-doped layer. The contact materials are hole-injecting here, in which case on the p-side, for example, a layer or a contact of ITO or Au can be provided, or electron-injecting, in which case on the n-side a layer or a contact of ITO, Al or Ag can be provided.

In the above structures the i-layer can also be omitted if required, as a result of which layer sequences with p-n or n-p transitions can be obtained.

The use of the described compounds is, however, not limited to the above-mentioned exemplary embodiments; in particular, the layer structures can be supplemented or modified by the introduction of additional suitable layers. In particular, OLEDs with such layer sequences, especially with pin—or with a structure inverse to it, can be fabricated with the described compounds.

In particular, organic diodes of the type metal-insulator-p-doped semiconductors (mip) or also, optionally of the pin-type, for example on the basis of zinc phthalocyanine, can be produced with the aid of the described p-dopants. These diodes show a rectification ratio of $10^5$ and higher. Furthermore, electronic components with p-n transitions can be produced using the dopants in accordance with the invention, in which case the same semiconductor material is used for the p- and the n-doped side (p-n-homojunction) and a described electron-poor transition metal complex compound is used for the n-doped semiconductor material.

The electron-poor transition metal complex compounds can be used in accordance with the invention in the electronic components but also in layers, conductivity paths, point contacts or the like if they predominate in contrast to another component, for example, as injection layer in pure or in substantially pure form.

Further tasks and advantages of the present invention will now be described in a clear manner using the following examples, which are to be considered solely as illustrative and not as limiting the scope of the invention.

EXAMPLES OF APPLICATION

An extremely electron-poor transition metal complex compound is provided in a very high purity.

The presented electron-poor transition metal complex compound is evaporated at the same time with the matrix material. The matrix material can for example be spiro-TTB or α-NPD according to the exemplary embodiment. The p-dopant and the matrix material can be evaporated in such a manner that the layer precipitated on the substrate in a vacuum evaporation system has a doping ratio of p-dopant to matrix material of 1:10.

The layer of the organic semiconductor material, which is in each case doped with the p-dopant is applied on an ITO layer (indium tin oxide) arranged on a glass substrate. After the application of the p-doped organic semiconductor layer a metal cathode is applied, for example, by vapor-depositing a suitable metal on it in order to produce an organic light-emitting diode. It is understood that the organic light-emitting diode can also have a so-called inverted layer construction in which the layer sequence is: Glass substrate metal cathode p-doped organic layer—transparent conductive cover layer (for example, ITO). It is understood that further layers can be provided between the individual mentioned layers depending on the application.

Example 1

The neutral nickel complex bis(cis-1,2-bis[trifluoromethyl]ethylene-1,2-dithiolato)nickel was used for the doping of spiro-TTB as matrix material. Doped layers with a doping ratio of dopant:matrix material of 1:10 were produced by mixed evaporation of matrix and dopant with spiro-TTB. The conductivity was $2 \times 10^{-4}$ S/cm.

Example 2

The neutral nickel complex bis(cis-1,2-bis[trifluoromethyl]ethylene-1,2-dithiolato)nickel was used for the doping of α-NPD as matrix material. Doped layers with a doping ratio of dopant:matrix material of 1:10 were produced by mixed evaporation of matrix and dopant with α-NPD. The conductivity was $2 \times 10^{-7}$ S/cm.

Example 3

The neutral cobalt complex bis(cis-1,2-bis[trifluoromethyl]ethylene-1,2-dithiolato)cobalt was used for the doping of ZnPc as matrix material. Doped layers with a doping ratio of dopant:matrix material of 1:10 were produced by mixed evaporation of matrix and dopant with ZnPc. The conductivity was $2 \times 10^{-4}$ S/cm.

Example 4

The neutral iron complex bis(cis-1,2-bis[trifluoromethyl]ethylene-1,2-dithiolato)iron was used for the doping of ZnPc as matrix material. Doped layers with a doping ratio of dopant:matrix material of 1:10 were produced by mixed evaporation of matrix and dopant with ZnPc. The conductivity was $3 \times 10^{-3}$ S/cm.

Example 5

The neutral nickel complex bis(cis-1,2-bis[trifluoromethyl]ethylene-1,2-dithiolato)nickel was used for the doping of ZnPc as matrix material. Doped layers with a doping ratio of dopant:matrix material of 1:10 were produced by mixed evaporation of matrix and dopant with ZnPc. The conductivity was $4 \times 10^{-5}$ S/cm.

The features of the invention disclosed in the preceding description and in the claims may be essential for the realization of the invention in its various embodiments both individually and in any combination thereof.

The invention claimed is:

1. A method for p-doping an organic semiconductive matrix material, the method comprising combining an electrical p-dopant with the organic semiconductive matrix material, wherein the electrical p-dopant is a square planar transition metal complex, wherein the square planar transition metal complex comprises one of the following structures:

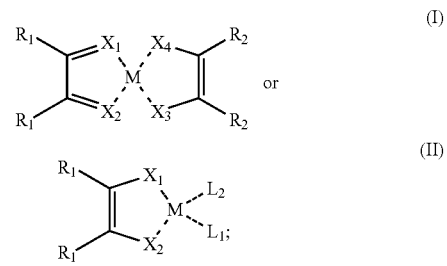

wherein:
M is a transition metal selected from groups 8 to 11 of the periodic system of the elements,
$X_1$, $X_2$, $X_3$, and $X_4$ are independently selected from the group consisting of S, N, and P, wherein N and P are substituted with $R_5$, and $R_5$ is independently selected from the group consisting of, substituted or unsubstituted, linear alkyl, branched alkyl, cycloalkyl, aryl, heteroaryl, condensed aromatic rings, donor groups, and acceptor groups,
$R_1$ and $R_2$ are independently selected from the group consisting of, substituted or unsubstituted, aromatic compounds, heteroaromatic compounds, aliphatic hydrocarbons, cycloaliphatic hydrocarbons, and nitrile,
$L_1$ and $L_2$ are independently selected from the group consisting of aromatic amine, aromatic phosphine, halogen, pseudohalogen, NCS, SCN, and CN, and
wherein the organic semiconductive matrix material is selected from the group consisting of metal phthalocyanine complexes, metal naphthocyanine complexes, metal porphyrine complexes, substituted or unsubstituted, arylated or heteroarylated amines, benzidine derivatives, imidazole derivatives, thiophene derivatives, thiazole derivatives, and dimeric, oligomeric, or polymeric heteroaromates, wherein the selected organic semiconductive matrix material has an oxidation potential, as determined by cyclovoltammetry, of greater than 0 V vs. Fc/Fc$^+$.

2. The method according to claim 1, wherein M is selected from the group consisting of nickel, copper, palladium, platinum, iron, cobalt, ruthenium, and osmium.

3. The method according to claim 1, wherein $R_1$ and $R_2$ are independently selected from the group consisting of substituted phenyl, anisyl, tolyl, 2-pyridyl, methyl, propyl, isopropyl, trifluoromethyl, pentafluoroethyl, and trichloromethyl.

4. An organic semiconductive material comprising at least one organic matrix compound and an electrical p-dopant, wherein the electrical p-dopant is a square planar transition metal complex, wherein the square planar transition metal complex has one of the following structures:

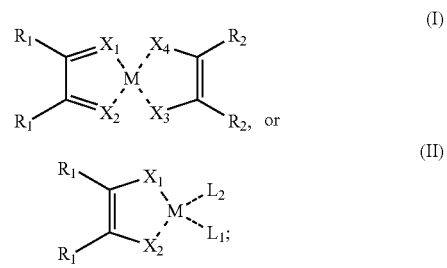

wherein:

M is a transition metal selected from groups 8 to 11 of the periodic system of the elements, $X_1$, $X_2$, $X_3$, and $X_4$ are independently selected from the group consisting of S, N, and P, wherein N and P are substituted with $R_5$, and $R_5$ is independently selected from, substituted or unsubstituted, linear alkyl, branched alkyl, cycloalkyl, aryl, heteroaryl, condensed aromatic rings, donor groups, and acceptor groups, $R_1$ and $R_2$ are independently selected from the group consisting of, substituted or unsubstituted, aromatic compounds, heteroaromatic compounds, aliphatic hydrocarbons, cycloaliphatic hydrocarbons, and nitrile, $L_1$ and $L_2$ are independently selected from the group consisting of aromatic amine, aromatic phosphine, halogen, pseudohalogen, NCS, SCN, and CN, and wherein the organic matrix compound is selected from the group consisting of metal phthalocyanine complexes, metal naphthocyanine complexes, metal porphyrine complexes, substituted or unsubstituted, arylated or heteroarylated amines, benzidine derivatives, imidazole derivatives, thiophene derivatives, thiazole derivatives, and dimeric, oligomeric, or polymeric heteroaromates, wherein the selected organic semiconductive matrix material has an oxidation potential, as determined by cyclovoltammetry, of greater than 0 V vs. $Fc/Fc^+$.

5. The organic semiconductive material according to claim 4, wherein the molar doping ratio of dopant to matrix molecule or the doping ratio of dopant to monomeric units of a polymeric matrix molecule is between 20:1 and 1:100,000.

6. The method according to claim 3, wherein the substituted phenyl is trifluoromethylphenyl.

7. The organic semiconductive material according to claim 5, wherein the molar doping ratio of dopant to matrix molecule or the doping ratio of dopant to monomeric units of a polymeric matrix molecule is between 10:1 and 1:1,000.

8. The organic semiconductive material according to claim 5, wherein the molar doping ratio of dopant to matrix molecule or the doping ratio of dopant to monomeric units of a polymeric matrix molecule is between 1:1 and 1:100.

* * * * *